United States Patent
Maru et al.

(10) Patent No.: US 9,520,794 B2
(45) Date of Patent: Dec. 13, 2016

(54) ACCELERATION OF OUTPUT ENERGY PROVISION FOR A LOAD DURING START-UP OF A SWITCHING POWER CONVERTER

(71) Applicant: KONINKLIJKE PHILIPS N.V., Eindhoven (NL)

(72) Inventors: Siddharth Maru, Austin, TX (US); Zhaohui He, Austin, TX (US); Mohit Sood, Austin, TX (US); Prashanth Drakshapalli, Austin, TX (US); Rahul Singh, Austin, TX (US)

(73) Assignee: PHILIPS LIGHTING HOLDING B.V, Eindhoven (NL)

( * ) Notice: Subject to any disclaimer, the term of this patent is extended or adjusted under 35 U.S.C. 154(b) by 511 days.

(21) Appl. No.: 13/829,231

(22) Filed: Mar. 14, 2013

(65) Prior Publication Data

US 2014/0028095 A1 Jan. 30, 2014

Related U.S. Application Data

(60) Provisional application No. 61/675,399, filed on Jul. 25, 2012.

(51) Int. Cl.
*H02M 3/335* (2006.01)
*H03K 17/14* (2006.01)
*H05B 33/08* (2006.01)

(52) U.S. Cl.
CPC ......... *H02M 3/33523* (2013.01); *H02M 3/335* (2013.01); *H03K 17/145* (2013.01);
(Continued)

(58) Field of Classification Search
CPC .................................................. H02M 3/335
(Continued)

(56) References Cited

U.S. PATENT DOCUMENTS 3,790,878 A 2/1974 Brokaw
4,677,366 A 6/1987 Wilkinson et al.
(Continued)

FOREIGN PATENT DOCUMENTS

EP 0536535 A1 4/1993
EP 0636889 A1 1/1995
(Continued)

OTHER PUBLICATIONS

Su, et al, Ultra Fast Fixed-Frequency Hysteretic Buck Converter with Maximum Charging Current Control and Adaptive Delay Compensation for DVS Applications, IEEE Journal of Solid-State Circuits, vol. 43, No. 4, Apr. 2008, pp. 815-822, Hong Kong University of Science and Technology, Hong Kong, China.
(Continued)

*Primary Examiner* — Matthew Nguyen
*Assistant Examiner* — Trinh Dang

(57) ABSTRACT

An electronic system and method include a controller to operate in a start-up mode to accelerate driving a load to an operating voltage and then operates in a post-start-up mode. A start-up condition occurs when the controller detects that a load voltage is below a predetermined voltage threshold level. The predetermined voltage threshold level is set so that the controller will boost the voltage to an operating value of a load voltage at a faster rate than during normal, steady-state operation. The controller causes a switching power converter to provide charge to the load at a rate in accordance with a start-up mode until reaching an energy-indicating threshold. When the energy-indicating threshold has been reached, the controller causes the switching power converter to (i) decrease the amount of charge provided to the load relative to the charge provided during the start-up mode and (ii) operate in a distinct post-start-up-mode.

24 Claims, 10 Drawing Sheets

(52) U.S. Cl.
CPC ..... *H05B 33/0815* (2013.01); *H05B 33/0848* (2013.01); *H05B 33/0884* (2013.01); *Y02B 20/341* (2013.01); *Y10T 307/406* (2015.04); *Y10T 307/832* (2015.04)

(58) Field of Classification Search
USPC ........... 363/21.07, 21.1, 21.11, 21.12, 21.13, 363/21.15, 49; 323/901
See application file for complete search history.

(56) References Cited

U.S. PATENT DOCUMENTS

| | | |
|---|---|---|
| 4,683,529 A | 7/1987 | Bucher |
| 4,737,658 A | 4/1988 | Kronmuller et al. |
| 4,739,462 A | 4/1988 | Farnsworth et al. |
| 4,937,728 A | 6/1990 | Leonardi |
| 4,940,929 A | 7/1990 | Williams |
| 4,977,366 A | 12/1990 | Powell |
| 5,001,620 A | 3/1991 | Smith |
| 5,003,454 A | 3/1991 | Bruning |
| 5,055,746 A | 10/1991 | Hu et al. |
| 5,109,185 A | 4/1992 | Ball |
| 5,173,643 A | 12/1992 | Sullivan et al. |
| 5,264,780 A | 11/1993 | Bruer et al. |
| 5,278,490 A | 1/1994 | Smedley |
| 5,383,109 A | 1/1995 | Maksimovic et al. |
| 5,424,932 A | 6/1995 | Inou et al. |
| 5,430,635 A | 7/1995 | Liu |
| 5,479,333 A | 12/1995 | McCambridge et al. |
| 5,481,178 A | 1/1996 | Wilcox et al. |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,757,635 A | 5/1998 | Seong |
| 5,764,039 A | 6/1998 | Choi et al. |
| 5,783,909 A | 7/1998 | Hochstein |
| 5,798,635 A | 8/1998 | Hwang et al. |
| 5,808,453 A | 9/1998 | Lee |
| 5,874,725 A | 2/1999 | Yamaguchi |
| 5,960,207 A | 9/1999 | Brown |
| 5,994,885 A | 11/1999 | Wilcox et al. |
| 6,043,633 A | 3/2000 | Lev et al. |
| 6,084,450 A | 7/2000 | Smith et al. |
| 6,091,233 A | 7/2000 | Hwang et al. |
| 6,160,724 A | 12/2000 | Hemena et al. |
| 6,229,292 B1 | 5/2001 | Redl et al. |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus |
| 6,343,026 B1 | 1/2002 | Perry |
| 6,356,040 B1 | 3/2002 | Preis et al. |
| 6,445,600 B2 | 9/2002 | Ben-Yaakov |
| 6,469,484 B2 | 10/2002 | L'Hermite et al. |
| 6,510,995 B2 | 1/2003 | Muthu et al. |
| 6,531,854 B2 | 3/2003 | Hwang |
| 6,580,258 B2 | 6/2003 | Wilcox et al. |
| 6,583,550 B2 | 6/2003 | Itwasa |
| 6,628,106 B1 | 9/2003 | Batarseh et al. |
| 6,657,417 B1 | 12/2003 | Hwang |
| 6,696,803 B2 | 2/2004 | Tao et al. |
| 6,724,174 B1 | 4/2004 | Esteves et al. |
| 6,768,655 B1 | 7/2004 | Yang et al. |
| 6,781,351 B2 | 8/2004 | Mednik et al. |
| 6,839,247 B1 | 1/2005 | Yang |
| 6,882,552 B2 | 4/2005 | Telefus et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,975,523 B2 | 12/2005 | Kim et al. |
| 6,980,446 B2 | 12/2005 | Simada et al. |
| 7,072,191 B2 | 7/2006 | Nakao et al. |
| 7,099,163 B1 | 8/2006 | Ying |
| 7,161,816 B2 | 1/2007 | Shteynberg et al. |
| 7,221,130 B2 | 5/2007 | Ribeiro et al. |
| 7,233,135 B2 | 6/2007 | Noma et al. |
| 7,266,001 B1 | 9/2007 | Notohamiprodjo et al. |
| 7,292,013 B1 | 11/2007 | Chen et al. |
| 7,295,452 B1 | 11/2007 | Liu |
| 7,411,379 B2 | 8/2008 | Chu |
| 7,554,473 B2 | 6/2009 | Melanson |
| 7,606,532 B2 | 10/2009 | Wuidart |
| 7,667,986 B2 | 2/2010 | Artusi et al. |
| 7,684,223 B2 | 3/2010 | Wei |
| 7,719,246 B2 | 5/2010 | Melanson |
| 7,719,248 B1 | 5/2010 | Melanson |
| 7,746,043 B2 | 6/2010 | Melanson |
| 7,804,480 B2 | 9/2010 | Jeon et al. |
| 7,834,553 B2 | 11/2010 | Hunt et al. |
| 7,872,883 B1 | 1/2011 | Elbanhawy |
| 7,894,216 B2 | 2/2011 | Melanson |
| 8,008,898 B2 | 8/2011 | Melanson et al. |
| 8,169,806 B2 | 5/2012 | Sims et al. |
| 8,193,717 B2 | 6/2012 | Leiderman |
| 8,222,772 B1 | 7/2012 | Vinciarelli |
| 8,242,764 B2 | 8/2012 | Shimizu et al. |
| 8,369,109 B2 | 2/2013 | Niedermeier et al. |
| 8,441,210 B2 | 5/2013 | Shteynberg et al. |
| 8,536,799 B1 | 9/2013 | Grisamore et al. |
| 8,610,364 B2 | 12/2013 | Melanson et al. |
| 8,803,439 B2 | 8/2014 | Stamm et al. |
| 8,816,593 B2 | 8/2014 | Lys et al. |
| 2003/0090252 A1 | 5/2003 | Hazucha |
| 2003/0111969 A1 | 6/2003 | Konishi et al. |
| 2003/0160576 A1 | 8/2003 | Suzuki |
| 2003/0174520 A1 | 9/2003 | Bimbaud |
| 2003/0214821 A1 | 11/2003 | Giannopoulos et al. |
| 2003/0223255 A1 | 12/2003 | Ben-Yaakov |
| 2004/0046683 A1 | 3/2004 | Mitamura et al. |
| 2004/0196672 A1 | 10/2004 | Amei |
| 2005/0057237 A1 | 3/2005 | Clavel |
| 2005/0207190 A1 | 9/2005 | Gritter |
| 2005/0231183 A1 | 10/2005 | Li et al. |
| 2005/0270813 A1 | 12/2005 | Zhang et al. |
| 2005/0275354 A1 | 12/2005 | Hausman |
| 2006/0013026 A1 | 1/2006 | Frank et al. |
| 2006/0022648 A1 | 2/2006 | Zeltser |
| 2006/0214603 A1 | 9/2006 | Oh et al. |
| 2007/0103949 A1 | 5/2007 | Tsuruya |
| 2008/0018261 A1 | 1/2008 | Kastner |
| 2008/0043504 A1 | 2/2008 | Ye |
| 2008/0062584 A1 | 3/2008 | Freitag et al. |
| 2008/0062586 A1 | 3/2008 | Apfel |
| 2008/0117656 A1 | 5/2008 | Clarkin |
| 2008/0130336 A1 | 6/2008 | Taguchi |
| 2008/0175029 A1 | 7/2008 | Jung et al. |
| 2008/0259655 A1 | 10/2008 | Wei et al. |
| 2008/0278132 A1 | 11/2008 | Kesterson et al. |
| 2008/0310194 A1 | 12/2008 | Huang et al. |
| 2009/0059632 A1 | 3/2009 | Li et al. |
| 2009/0067204 A1 | 3/2009 | Ye et al. |
| 2009/0108677 A1 | 4/2009 | Walter et al. |
| 2009/0184665 A1 | 7/2009 | Ferno |
| 2009/0243582 A1* | 10/2009 | Irissou et al. .................. 323/320 |
| 2009/0295300 A1 | 12/2009 | King |
| 2010/0128501 A1 | 5/2010 | Huang et al. |
| 2010/0238689 A1 | 9/2010 | Fei et al. |
| 2010/0244793 A1 | 9/2010 | Caldwell |
| 2011/0110132 A1 | 5/2011 | Rausch |
| 2011/0199793 A1 | 8/2011 | Kuang |
| 2011/0276938 A1 | 11/2011 | Perry et al. |
| 2011/0291583 A1 | 12/2011 | Shen |
| 2011/0309760 A1 | 12/2011 | Beland et al. |
| 2012/0056551 A1* | 3/2012 | Zhu et al. ..................... 315/232 |
| 2012/0146540 A1 | 6/2012 | Khayat et al. |
| 2012/0153924 A1* | 6/2012 | Lipka ..................... G05F 1/56 323/299 |
| 2012/0176819 A1* | 7/2012 | Gao et al. .................. 363/21.12 |
| 2012/0187997 A1 | 7/2012 | Liao et al. |
| 2012/0248998 A1 | 10/2012 | Yoshinaga |

(56) References Cited

U.S. PATENT DOCUMENTS

| | | |
|---|---|---|
| 2012/0320640 A1 | 12/2012 | Baurle et al. |
| 2013/0181635 A1 | 7/2013 | Ling |
| 2014/0218978 A1 | 8/2014 | Heuken et al. |

FOREIGN PATENT DOCUMENTS

| | | |
|---|---|---|
| EP | 1213823 A2 | 6/2002 |
| EP | 1289107 A3 | 8/2002 |
| EP | 1962263 A2 | 8/2008 |
| EP | 2232949 | 9/2010 |
| EP | 2257124 A1 | 12/2010 |
| JP | 2008053181 A | 3/2006 |
| WO | 01/84697 A2 | 11/2001 |
| WO | 2004/051834 A1 | 6/2004 |
| WO | 2006013557 A1 | 2/2006 |
| WO | 2006/022107 A1 | 3/2006 |
| WO | 2007016373 A3 | 2/2007 |
| WO | 2008/004008 A2 | 1/2008 |
| WO | 2008152838 A2 | 12/2008 |
| WO | 2010011971 A1 | 1/2010 |
| WO | 2010065598 A2 | 6/2010 |
| WO | 2011008635 A1 | 1/2011 |

OTHER PUBLICATIONS

Wong, et al, "Steady State Analysis of Hysteretic Control Buck Converters", 2008 13th International Power Electronics and Motion Control Conference (EPE-PEMC 2008), pp. 400-404, 2008, National Semiconductor Corporation, Power Management Design Center, Hong Kong, China.

Zhao, et al, Steady-State and Dynamic Analysis of a Buck Converter Using a Hysteretic PWM Control, 2004 35th Annual IEEE Power Electronics Specialists Conference, pp. 3654-3658, Department of Electrical & Electronic Engineering, Oita University, 2004, Oita, Japan.

Texas Instruments, High Performance Power Factor Preregulator, UC2855A/B and UC3855A/B, SLUS328B, Jun. 1998, Revised Oct. 2005, pp. 1-14, Dallas, TX, USA.

Balogh, Laszlo, et al,Power-Factor Correction with Interleaved Boost Converters in Continuous-Inductr-Current Mode, 1993, IEEE, pp. 168-174, Switzerland.

Cheng, Hung L., et al, A Novel Single-Stage High-Power-Factor Electronic Ballast with Symmetrical Topology, Power Electronics and Motion Control Conference, 2006. IPEMC 2006. CES/IEEE 5th International, Aug. 14-16, 2006, vol. 50, No. 4, Aug. 2003, pp. 759-766, Nat. Ilan Univ., Taiwan.

Fairchild Semiconductor, Theory and Application of the ML4821 Average Current Mode PFC Controllerr, Fairchild Semiconductor Application Note 42030, Rev. 1.0, Oct. 25, 2000, pp. 1-19, San Jose, California, USA.

Garcia, O., et al, High Efficiency PFC Converter to Meet EN610000302 and A14, Industrial Electronics, 2002. ISIE 2002. Proceedings of the 2002 IEEE International Symposium, vol. 3, pp. 975-980, Div. de Ingenieria Electronica, Univ. Politecnica de Madrid, Spain.

Infineon Technologies AG, Standalone Power Factor Correction (PFC) Controller in Continuous Conduction Mode (CCM), Infineon Power Management and Supply, CCM-PFC, ICE2PCS01, ICE2PCS01G, Version 2.1, Feb. 6, 2007, p. 1-22, Munchen, Germany.

Lu, et al, Bridgeless PFC Implementation Using One Cycle Control Technique, International Rectifier, 2005, pp. 1-6, Blacksburg, VA, USA.

Brown, et al, PFC Converter Design with IR1150 One Cycle Control IC, International Rectifier, Application Note AN-1077, pp. 1-18, El Segundo CA, USA.

International Rectifer, PFC One Cycle Control PFC IC, International Rectifier, Data Sheet No. PD60230 rev. C, IR1150(S)(PbF), IR11501(S)(PbF), Feb. 5, 2007, pp. 1-16, El Segundo, CA, USA.

International Rectifier, IRAC1150=300W Demo Board, User's Guide, Rev 3.0, International Rectifier Computing and Communications SBU—AC-DC Application Group, pp. 1-18, Aug. 2, 2005, El Segundo, CO USA.

Lai, Z., et al, A Family of Power-Factor-Correction Controller, Applied Power Electronics Conference and Exposition, 1997. APEC '97 Conference Proceedings 1997., Twelfth Annual, vol. 1, pp. 66-73, Feb. 23-27, 1997, Irvine, CA.

Lee, P, et al, Steady-State Analysis of an Interleaved Boost Converter with Coupled Inductors, IEEE Transactions on Industrial Electronics, vol. 47, No. 4, Aug. 2000, pp. 787-795, Hung Hom, Kowloon, Hong Kong.

Linear Technology, Single Switch PWM Controller with Auxiliary Boost Converter, Linear Technology Corporation, Data Sheet LT1950, pp. 1-20, Milpitas, CA, USA.

Linear Technology, Power Factor Controller, Linear Technology Corporation, Data Sheet LT1248, pp. 1-12, Milpitas, CA, USA.

Supertex, Inc., HV9931 Unity Power Factor LED Lamp Driver, Supertex, Inc., Application Note AN-H52, 2007, pp. 1-20, Sunnyvale, CA, USA.

Ben-Yaakov, et al, The Dynamics of a PWM Boost Converter with Resistive Input, IEEE Transactions on Industrial Electronics, vol. 46., No. 3, Jun. 1999, pp. 1-8, Negev, Beer-Sheva, Israel.

Erickson, Robert W., et al, Fundamentals of Power Electronics, Second Edition, Chapter 6, 2001, pp. 131-184, Boulder CO, USA.

Stmicroelectronics, CFL/TL Ballast Driver Preheat and Dimming L6574, Sep. 2003, pp. 1-10, Geneva, Switzerland.

Fairchild Semiconductor, 500W Power-Factor-Corrected (PFC) Converter Design with FAN4810, Application Note 6004, Rev. 1.0.1, Oct. 31, 2003, pp. 1-14, San Jose, CA, USA.

Fairfield Semiconductor, Power Factor Correction (PFC) Basics, Application Note 42047, Rev. 0.9.0, Aug. 19, 2004, pp. 1-11, San Jose, CA, USA.

Fairchild Semiconductor, Design of Power Factor Correction Circuit Using FAN7527B, Application Note AN4121, Rev. 1.0.1, May 30, 2002, pp. 1-12, San Jose, CA, USA.

Fairchild Semiconductor, Low Start-Up Current PFC/PWM Controller Combos FAN4800, Rev. 1.0.6, Nov. 2006, pp. 1-20, San Jose, CA, USA.

Prodic, Aleksander, Compensator Design and Stability Assessment for Fast Voltage Loops of Power Factor Correction Rectifiers, IEEE Transactions on Power Electronics, vol. 22, Issue 5, Sep. 2007, pp. 1719-1730, Toronto, Canada.

Fairchild Semiconductor, ZVS Average Current PFC Controller FAN 4822, Rev. 1.0.1, Aug. 10, 2001, pp. 1-10, San Jose, CA, USA.

Prodic, et al, Dead-Zone Digital Controller for Improved Dynamic Response of Power Factor Preregulators, Applied Power Electronics Conference and Exposition, 2003, vol. 1, pp. 382-388, Boulder CA, USA.

Philips Semiconductors, 90W Resonant SMPS with TEA1610 Swing Chip, Application Note AN99011, Sep. 14, 1999, pp. 1-28, The Netherlands.

Stmicroelectronics, Advanced Transition-Mode PFC Controller L6563 and L6563A, Mar. 2007, pp. 1-40, Geneva, Switzerland.

On Semiconductor, Power Factor Controller for Compact and Robust, Continuous Conduction Mode Pre-Converters, NCP1654, Mar. 2007, Rev. PO, pp. 1-10, Denver, CO, USA.

Fairchild Semicondctor, Simple Ballast Controller, KA7541, Rev. 1.0.3, Sep. 27, 2001, pp. 1-14, San Jose, CA, USA.

Fairchild Semiconductor, Power Factor Controller, ML4812, Rev. 1.0.4, May 31, 2001, pp. 1-18, San Jose, CA, USA.

Prodic, et al, Digital Controller for High-Frequency Rectifiers with Power Factor Correction Suitable for On-Chip Implementation, Power Conversion Conference-Nagoya, 2007. PCC '07, Apr. 2-5, 2007, pp. 1527-1531, Toronto, Canada.

Freescale Semiconductor, Dimmable Light Ballast with Power Factor Correction, Designer Reference Manual, DRM067, Rev. 1, Dec. 2005, M68HC08 Microcontrollers, pp. 1-72, Chandler, AZ, USA.

Freescale Semiconductor, Design of Indirect Power Factor Correction Using 56F800/E, Freescale Semiconductor Application Note, AN1965, Rev. 1, Jul. 2005, pp. 1-20, Chandler, AZ, USA.

(56) References Cited

OTHER PUBLICATIONS

Freescale Semiconductor, Implementing PFC Average Current Mode Control using the MC9S12E128, Application Note AN3052, Addendum to Reference Design Manual DRM064, Rev. 0, Nov. 2005, pp. 1-8, Chandler, AZ, USA.
Hirota, et al, Analysis of Single Switch Delta-Sigma Modulated Pulse Space Modulation PFC Converter Effectively Using Switching Power Device, Power Electronics Specialists Conference, 2002. pesc 02. 2002 IEEE 33rd Annual, vol. 2, pp. 682-686, Hyogo Japan.
Madigan, et al, Integrated High-Quality Rectifier-Regulators, Industrial Electronics, IEEE Transactions, vol. 46, Issue 4, pp. 749-758, Aug. 1999, Cary, NC, USA.
Renesas, Renesas Technology Releases Industry's First Critical-Conduction-Mode Power Factor Correction Control IC Implementing Interleaved Operations, R2A20112, pp. 1-4, Dec. 18, 2006, Tokyo, Japan.
Renesas, PFC Control IC R2A20111 Evaluation Board, Application Note R2A20111 EVB, all pages, Feb. 2007, Rev. 1.0, pp. 1-39, Tokyo, Japan.
Miwa, et al, High Efficiency Power Factor Correction Using Interleaving Techniques, Applied Power Electronics Conference and Exposition, 1992. APEC '92. Conference Proceedings 1992., Seventh Annual, Feb. 23-27, 1992, pp. 557-568, MIT, Cambridge, MA, USA.
Noon, Jim, High Performance Power Factor Preregulator UC3855A/B, Texas Instruments Application Report, SLUA146A, May 1996-Revised Apr. 2004, pp. 1-35, Dallas TX, USA.
NXP Semiconductors, TEA1750, GreenChip III SMPS Control IC Product Data Sheet, Rev.01, Apr. 6, 2007, pp. 1-29, Eindhoven, The Netherlands.
Turchi, Joel, Power Factor Correction Stages Operating in Critical Conduction Mode, ON Semiconductor, Application Note AND8123/D, Sep. 2003—Rev. 1 , pp. 1-20, Denver, CO, USA.
On Semiconductor, GreenLine Compact Power Factor Controller: Innovative Circuit for Cost Effective Solutions, MC33260, Semiconductor Components Industries, Sep. 2005—Rev. 9, pp. 1-22, Denver, CO, USA.
On Semiconductor, Enhanced, High Voltage and Efficient Standby Mode, Power Factor Controller, NCP1605, Feb. 2007, Rev. 1, pp. 1-32, Denver, CO, USA.
On Semiconductor, Cost Effective Power Factor Controller, NCP1606, Mar. 2007, Rev. 3, pp. 1-22, Denver, CO, USA.
Renesas, Power Factor Correction Controller IC, HA16174P/FP, Rev. 1.0, Jan. 6, 2006, pp. 1-38, Tokyo, Japan.
Seidel, et al, A Practical Comparison Among High-Power-Factor Electronic Ballasts with Similar Ideas, IEEE Transactions on Industry Applications, vol. 41, No. 6, Nov./Dec. 2005, pp. 1574-1583, Santa Maria, Brazil.
Stmicroelectronics, Electronic Ballast with PFC using L6574 and L6561, Application Note AN993, May 2004, pp. 1-20, Geneva, Switzerland.
International Search Report, PCT/US2013/051827, European Patent Office, Jan. 3, 2014, pp. 1-4.
Written Opinion, PCT/US2013/051827, European Patent Office, Jan. 3, 2014, pp. 1-5.
Maksimovic, et al, Impact of Digital Control in Power Electronics, International Symposium on Power Semiconductor Devices and ICS, 2004, pp. 2-22, Boulder, Colorado, USA.
Fairchild Semiconductor, Ballast Control IC, FAN 7711, Rev. 1.0.3, 2007, pp. 1-23, San Jose,California, USA.
Yao, Gang et al, Soft Switching Circuit for Interleaved Boost Converters, IEEE Transactions on Power Electronics, vol. 22, No. 1, Jan. 2007, pp. 1-8, Hangzhou China.
Stmicroelectronics, Transition Mode PFC Controller, Datasheet L6562, Rev. 8, Nov. 2005, pp. 1-16, Geneva, Switzerland.
Zhang, Wanfeng et al, A New Duty Cycle Control Strategy for Power Factor Correction and FPGA Implementation, IEEE Transactions on Power Electronics, vol. 21, No. 6, Nov. 2006, pp. 1-10, Kingston, Ontario, Canada.
Stmicroelectronics, Power Factor Connector L6561, Rev 16, Jun. 2004, pp. 1-13, Geneva, Switzerland.
Texas Instruments, Avoiding Audible Noise at Light Loads When Using Leading Edge Triggered PFC Converters, Application Report SLUA309A, Mar. 2004-Revised Sep. 2004, pp. 1-4, Dallas, Texas, USA.
Texas Instruments, Startup Current Transient of the Leading Edge Triggered PFC Controllers, Application Report SLUA321, Jul. 2004, pp. 1-4, Dallas, Texas, USA.
Texas Instruments, Current Sense Transformer Evaluation UCC3817, Application Report SLUA308, Feb. 2004, pp. 1-3, Dallas, Texas, USA.
Texas Instruments, BiCMOS Power Factor Preregulator Evaluation Board UCC3817, User's Guide, SLUU077C, Sep. 2000-Revised Nov. 2002, pp. 1-10, Dallas, Texas, USA.
Texas Instruments, Interleaving Continuous Conduction Mode PFC Controller, UCC28070, SLUS794C, Nov. 2007-Revised Jun. 2009, pp. 1-45, Dallas, Texas, USA.
Texas Instruments, 350-W Two-Phase Interleaved PFC Pre-regulator Design Review, Application Report SLUA369B, Feb. 2005-Revised Mar. 2007, pp. 1-22, Dallas, Texas, USA.
Texas Instruments, Average Current Mode Controlled Power Factor Correction Converter using TMS320LF2407A, Application Report SPRA902A, Jul. 2005, pp. 1-15, Dallas, Texas, USA.
Texas Instruments, Transition Mode PFC Controller, UCC28050, UCC28051, UCC38050, UCC38051, Application Note SLUS515D, Sep. 2002-Revised Jul. 2005, pp. 1-28, Dallas, Texas, USA.
Unitrode, High Power-Factor Preregulator, UC1852, UC2852, UC3852, Feb. 5, 2007, pp. 1-8, Merrimack, Maine, USA.
Unitrode, Optimizing Performance in UC3854 Power Factor Correction Applications, Design Note DN 39E, 1999, pp. 1-6, Merrimack, Maine, USA.
On Semiconductor Four Key Steps to Design a Continuous Conduction Mode PFC Stage Using the NCP1653, Application Note AND8184/D, Nov. 2004, pp. 1-8, Phoenix, AZ, USA.
Unitrode, BiCMOS Power Factor Preregulator, Texas Instruments, UCC2817, UCC2818, UCC3817, UCC3818, SLUS3951, Feb. 2000-Revised Feb. 2006, pp. 1-25, Dallas, Texas, USA.
Unitrode, UC3854A/B and UC3855A/B Provide Power Limiting with Sinusoidal Input Current for PFC Front Ends, SLUA196A, Design Note DN-66, Jun. 1995-Revised Nov. 2001, pp. 1-6, Merrimack, Maine, USA.
Unitrode, Programmable Output Power Factor Preregulator, UCC2819, UCC3819, SLUS482B, Apr. 2001-Revised Dec. 2004, pp. 1-16, Merrimack, Maine, USA.
Texas Instruments, UCC281019, 8-Pin Continuous Conduction Mode (CCM) PFC Controller, SLU828B, Revised Apr. 2009, pp. 1-48, Dallas, Texas, USA.
http://toolbarpdf.com/docs/functions-and-features-of=inverters. html, Jan. 20, 2011, pp. 1-8.
Zhou, Jinghai, et al, Novel Sampling Algorithm for DSP Controlled 2kW PFC Converter, IEEE Transactions on Power Electronics, vol. 16, No. 2, Mar. 2001, pp. 1-6, Hangzhou, China.
Mammano, Bob, Current Sensing Solutions for Power Supply Designers, Texas Instruments, 2001, pp. 1-36, Dallas, Texas, USA.
Fairchild Semiconductor, Ballast Control IC FAN7532, Rev. 1.0.3, Jun. 2006, pp. 1-16, San Jose, California, USA.
Fairchild Semiconductor, Simple Ballast Controller, FAN7544, Rev. 1.0.0, Sep. 21, 2004, pp. 1-14, San Jose, California, USA.

* cited by examiner

ACCELERATION OF OUTPUT ENERGY PROVISION FOR A LOAD DURING START-UP OF A SWITCHING POWER CONVERTER

CROSS-REFERENCE TO RELATED APPLICATION

This application claims the benefit under 35 U.S.C. §119 (e) and 37 C.F.R. §1.78 of U.S. Provisional Application No. 61/675,399, filed on Jul. 25, 2012, which is incorporated by reference in its entirety.

BACKGROUND OF THE INVENTION

Field of the Invention

The present invention relates in general to the field of electronics, and more specifically to a system and method of acceleration of output energy provision for a load during start-up of a switching power converter.

Description of the Related Art

Many electronic systems include circuits, such as switching power converters to provide efficient power conversion from a voltage supply into a regulated output voltage. Often, a controller controls the power conversion process of a switching power converter. The switching power converter converts input power from a supply voltage source into an amount of output power utilized by a load.

FIG. 1 depicts a flyback-type switching power converter 100 that converts the input voltage $V_{INT}$ into a constant current $i_S$ and load voltage $V_{LD}$ on the side of the secondary-winding 116 of the transformer 112 and to a converter supply voltage $V_{DD}$ on the side of the auxiliary-winding 124. In at least one embodiment, the input voltage $V_{IN}$ is a rectified nominally 60 Hz/110 V line voltage in the United States of America or a nominally 50 Hz/220 V line voltage in Europe and the People's Republic of China. The controller 102 generates a switch control signal CNTRL to control the flyback-type, switching power converter 104. The control signal CNTRL controls the conductivity of field effect transistor (FET) switch 106 to control the primary current $i_P$ to meet the power demands of load 108. For an n-channel FET, the FET conducts (i.e. ON) when the switch control signal CNTRL is a logical one and is nonconductive (i.e. OFF) when the switch control signal CNTRL is a logical zero.

When the FET 106 conducts, the primary current $i_P$ ramps up through the primary winding 110 of transformer 112. The dot convention of transformer 112 and the diode 114 prevent flow of the secondary current $i_S$ from the secondary-winding 116 when FET 106 conducts and the primary current $i_P$ is flowing into the primary winding 110. When the controller 102 generates the switch control signal CNTRL to turn FET 106 OFF, the primary current $i_P$ falls to 0, and the voltage across the primary winding 110 reverses (also referred to as "flyback"). During the flyback, the secondary current $i_S$ quickly rises and charges capacitor 118. Capacitor 118 provides an output voltage $V_{LD}$ and current to the load 108. The load can be any type of load including one or more light emitting diodes. A diode and resistor-capacitor filter circuit 120 provides a path for voltage perturbations.

After the switching power converter 104 begins operation, an auxiliary power supply 122 provides the supply voltage $V_{DD}$ for controller 102. The auxiliary power supply 122 includes an auxiliary-winding 124 with the same dot convention as the secondary-winding 116. The FET 126 is biased by a fixed gate voltage $V_G$ to conduct the auxiliary current $i_{AUX}$ through diode 130 and resistor 132 to the $V_{DD}$ voltage node. When the controller supply voltage $V_{DD}$ falls below the gate voltage $V_G$ minus a threshold voltage $V_{TH}$ of the FET 126, the FET 126 conducts and charges the $V_{DD}$ node, which charges capacitor 128. When the voltage $V_{DD}$ reaches $V_G+V_{TH}$, the FET 126 stops conducting. Capacitor 128 stores energy to assist in providing a relatively constant value of the controller supply voltage $V_{DD}$. Capacitor 129 provides a charge reservoir to provide charge to capacitor 128 when the FET 126 turns ON.

The controller supply voltage $V_{DD}$ varies in accordance with varying power demands by controller 102. Thus, the auxiliary power supply 126 provides power to the controller 102 in accordance with the varying power demands of controller 102. When the auxiliary power supply 126 provides charge to the capacitor 128, the auxiliary power supply 126 takes charge from the primary winding 110 that would otherwise be provided to the secondary-winding 116. Since the power demands of the auxiliary power supply 122 are not monitored, the amount of power actually delivered to the secondary-winding 116 and, thus, the load 108 is not accurately known.

SUMMARY OF THE INVENTION

In one embodiment of the present invention, a method includes detecting a start-up condition of a load and causing a switching power converter to provide an amount of charge to the load at a rate in accordance with a start-up mode until reaching an energy-indicating threshold. The method further includes determining if the energy-indicating threshold has been reached and, when the energy-indicating threshold has been reached, causing the switching power converter to (i) decrease the amount of charge provided to the load relative to the charge provided during the start-up mode and (ii) operate in a distinct post-start-up-mode.

In another embodiment of the present invention, an apparatus includes a controller. The controller is configured to detect a start-up condition of a load and cause a switching power converter to provide an amount of charge to the load at a rate in accordance with a start-up mode until reaching an energy-indicating threshold. The controller is further configured to determine if the energy-indicating threshold has been reached, and, when the energy-indicating threshold has been reached, to cause the switching power converter to (i) decrease the amount of charge provided to the load relative to the charge provided during the start-up mode and (ii) operate in a distinct post-start-up-mode.

In a further embodiment of the present invention, an apparatus includes a switching power converter, a load coupled to the switching power converter, and a controller, coupled to the switching power converter. The controller is configured to detect a start-up condition of a load and cause a switching power converter to provide an amount of charge to the load at a rate in accordance with a start-up mode until reaching an energy-indicating threshold. The controller is further configured to determine if the energy-indicating threshold has been reached, and, when the energy-indicating threshold has been reached, to cause the switching power converter to (i) decrease the amount of charge provided to the load relative to the charge provided during the start-up mode and (ii) operate in a distinct post-start-up-mode.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
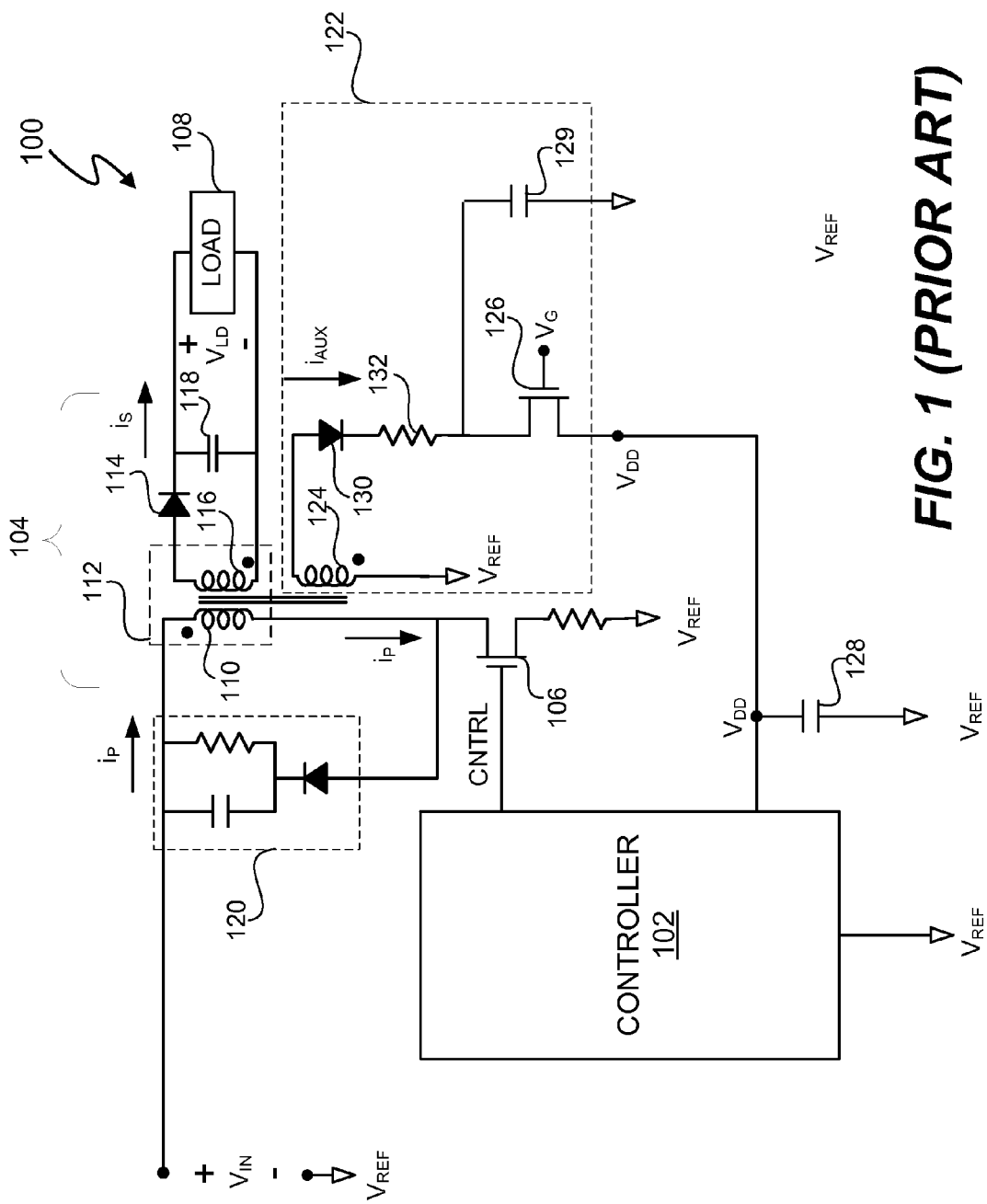
FIG. 1 (labeled prior art) depicts a flyback-type switching power converter and an auxiliary power supply.

An electronic system and method include a controller to operate in a start-up mode to accelerate driving a load to an operating voltage and then operates in a post-start-up mode. In at least one embodiment, a start-up condition occurs when the controller detects that a load voltage is below a predetermined voltage threshold level. In at least one embodiment, the predetermined voltage threshold level is set so that the controller will boost the voltage to an operating value of a load voltage at a faster rate than during normal, steady-state operation. In at least one embodiment, the controller controls a switching power converter and causes the switching power converter to provide an amount of charge to the load at a rate in accordance with a start-up mode until reaching an energy-indicating threshold. When the controller determines that the energy-indicating threshold has been reached, the controller causes the switching power converter to (i) decrease the amount of charge provided to the load relative to the charge provided during the start-up mode and (ii) operate in a distinct post-start-up-mode.

In at least one embodiment, in a normal operating mode, during each cycle of an input voltage to the switching power converter, the controller provides an amount of charge to the load until target amount of charge has been provided. The target amount of charge is dependent upon a variety of circuit characteristics, such as the charge storage capacity of the load, the power utilization by the load, any phase-cut angle of the input voltage, etc. In at least one embodiment, the target amount of charge is set to smoothly transition the load voltage to an operating value of the load voltage $V_{LD}$. However, when the load voltage is below a predetermined threshold, providing charge to the load using the normal operating mode can result in an extended amount of time before the load reaches the operating value of the load voltage $V_{LD}$. For example, when the load includes a capacitor and one or more light emitting diodes (LEDs), as many as 10-13 seconds can elapse before the capacitor reaches the operating voltage value for the LEDs. In at least one embodiment, in the start-up mode, the controller disregards circuit characteristics that would otherwise limit the rate at which charge is delivered to the load, and the controller provides as much charge to the load at the highest possible rate until the load reaches energy-indicating threshold, which, in at least one embodiment, indicates that load voltage has reached the operating voltage value. In the start-up mode, the controller can, in at least one embodiment, drive the load voltage $V_{LD}$ to the operating voltage value within 1-2 seconds for the LEDs.

The process of determining when the load voltage $V_{LD}$ has reached the operating voltage value is a matter of design choice. In at least one embodiment, the controller detects the change of the load voltage over time, i.e. the rate of change of the load voltage. As the load voltage approaches the operating voltage value, the rate of increase of the load voltage will decrease over time. Thus, in at least one embodiment, the energy-indicating threshold represents a threshold change of the load voltage over time, and the controller begins operating in a post-start-up mode once the rate of change of the load voltage reaches the threshold rate of change. This particular embodiment provides flexibility in the controller and a lamp that includes the controller in general because the threshold change of the load voltage over time is, in at least one embodiment, not dependent on any particular load voltage level. In another embodiment, the controller compares a representation of the load voltage to a predetermined voltage threshold to determine when the load voltage is close enough to the operating voltage value to allow the controller to begin operating in a post-start-up mode. In at least one embodiment, the controller compares a time duration of a current used to charge the capacitor of the load, which represents an amount of charge provided to the load. As the load voltage nears the operating voltage value, the time duration decreases. Thus, in at least one embodiment, a minimum duration of the current used to charge the capacitor of the load represents the energy-indicating time, and the controller transitions to a post-start-up mode of operation once the time duration reaches the threshold.

Figure 2:
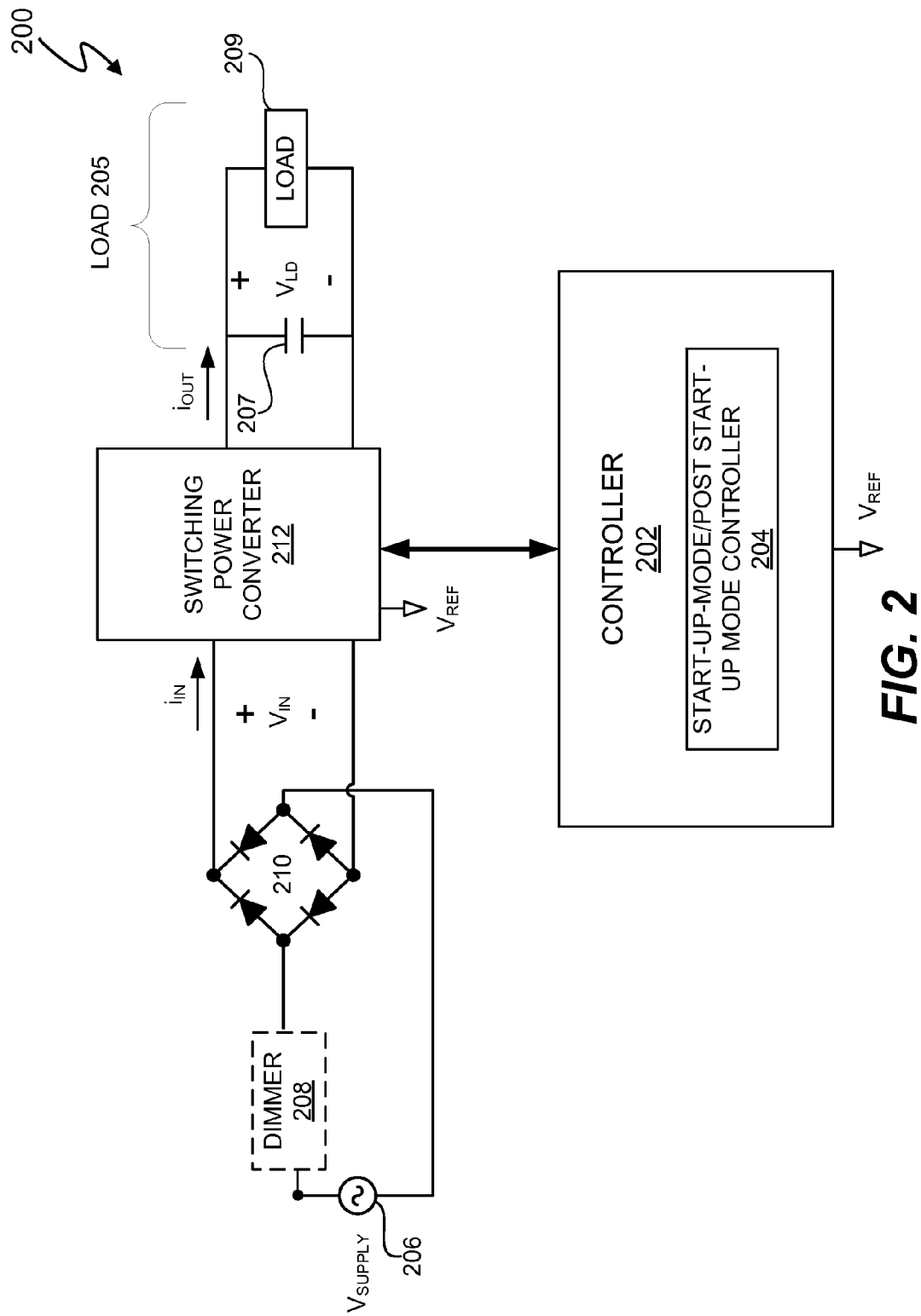
FIG. 2 depicts an electronic system that includes a start-up-mode/post-start-up-mode controller.

FIG. 2 depicts an electronic system 200 that includes a controller 202, and the controller 202 includes start-up-mode/post-start-up-mode controller 204. The start-up-mode/post-start-up-mode controller 204 detects a start-up condition of the load 205 and increases the amount of charge provided to the load 205 relative to the amount of charge provided during normal operation after the switching power converter 212 has charged the load capacitor 207 to an operating voltage value. The load 205 includes the capacitor 207 and a load 209. The load 209 can be any type of load, such as a load that includes one or more electronic light sources such as one or more light emitting diodes (LEDs). Voltage source 206 generates a supply voltage $V_{SUPPLY}$, such as a nominally 60 Hz/110 V alternating current (AC) line voltage in the United States of America or a nominally 50 Hz/220 V AC line voltage in Europe and the People's Republic of China. An optional dimmer 208, such as a triac-based dimmer, phase cuts the supply voltage $V_{SUPPLY}$, and full-bridge rectifier 210 generates a rectified AC input voltage $V_{IN}$ as an input voltage to the switching power converter 212. The switching power converter 212 can be any type of switching power converter including single or multiple stage switching power converter, a boost, buck, boost-buck, Cúk, or flyback type switching power converter.

During normal operation, the input voltage $V_{IN}$ rises during each half cycle of the supply voltage $V_{SUPPLY}$, and the controller 202 controls the switching power converter 212 to deliver charge to the load capacitor 207 via output current $i_{OUT}$. During normal operation, and for a constant voltage, constant current load 209, the controller 202 attempts to maintain the load voltage $V_{LD}$ across the load capacitor 207 at an approximately constant level. However, when the electronic system 200 is turned OFF, the load voltage $V_{LD}$ falls to zero or approximately zero volts.

When the electronic system 200 is turned ON and the input voltage $V_{IN}$ begins to rise during each half cycle of the supply voltage $V_{SUPPLY}$, the start-up-mode/post-start-up-mode controller 204 detects a start-up condition of the electronic system 200. The manner of detecting the start-up condition is a matter of design choice. In at least one embodiment, start-up-mode/post-start-up-mode controller 204 detects the start-up condition when the load voltage $V_{LD}$ is below a predetermined voltage threshold level. In at least one embodiment, the predetermined voltage threshold level is set so that the start-up-mode/post-start-up-mode controller 204 detects a start-up condition while ignoring perturbations of the input voltage $V_{IN}$ during normal operation. In at least one embodiment, the predetermined voltage threshold level for the load voltage $V_{LD}$ is 70% of a nominal, operating level of the load voltage $V_{LD}$. The particular value of the predetermined threshold voltage level for the load voltage $V_{LD}$ is a matter of design choice. In at least one embodiment, the predetermined threshold voltage level for the load voltage $V_{LD}$ takes into account circuit operating characteristics, such as the voltage drop across the load 209, such as forward-bias voltages across LEDs when the load 209 includes LEDs. As the voltage drop across the load 209 is more tightly controlled, the percentage of the predetermined voltage threshold level for the load voltage $V_{LD}$ relative to a nominal, operating level of the load voltage $V_{LD}$ can increase.

To rapidly provide charge to the load capacitor 207 during start-up mode, the start-up-mode/post-start-up-mode controller 204 controls the switching power converter 212 and causes the switching power converter 212 to provide an amount of charge to the load 205 at a rate that accelerates the provision of charge to the load 205 relative to the rate of providing charge during a normal mode of operation. The start-up-mode/post-start-up-mode controller 204 continues to operate the switching power converter 212 in start-up mode until the load 205 reaches an energy-indicating threshold. When the start-up-mode/post-start-up-mode controller 204 determines that the energy-indicating threshold has been reached, the start-up-mode/post-start-up-mode controller 204 causes the switching power converter 212 to (i) decrease the amount of charge provided to the load relative to the charge provided during the start-up mode and (ii) operate in a distinct post-start-up, normal operating mode. The particular energy-indicating threshold is a matter of design choice. As subsequently described in more detail, a minimum threshold rate of change of the load voltage $V_{LD}$ over time, a value of the load voltage $V_{LD}$, and a duration of the output current $i_{OUT}$ during a cycle of a control switch (such as switch 312 of FIG. 3) of the switching power converter 212 represent exemplary energy-indicating thresholds.

Figure 3:
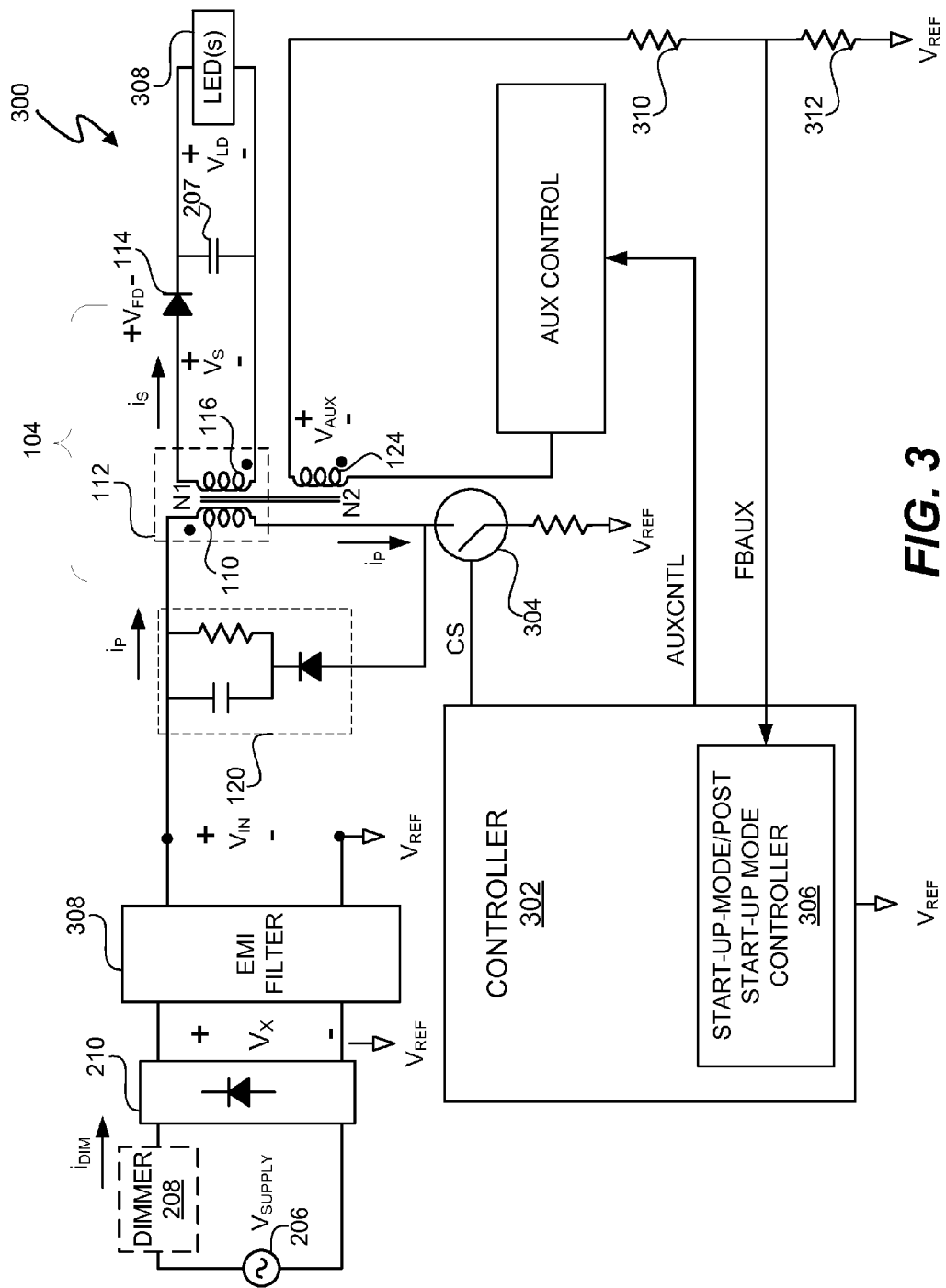
FIG. 3 depicts an embodiment of the electronic system of FIG. 2.

FIG. 3 depicts an electronic system 300, which represents one embodiment of the electronic system 200. The electronic system 300 includes single stage, flyback-type switching power converter 104 that converts the input voltage $V_{IN}$ and primary-side current ip into a current $i_S$ and load voltage $V_{LD}$ using the same circuit principles as previously discussed with reference to FIG. 1. The controller 302 generates a switch control signal CS to control conductivity of the switch 304, which is, for example, a field effect transistor. The start-up-mode/post-start-up-mode controller 306 represents one embodiment of the start-up-mode/post-start-up-mode controller 204. The start-up-mode/post-start-up-mode controller 306 is referred to as the "SM-PSM controller 306". The auxiliary control circuitry 304 is optional and a matter of design choice. In at least one embodiment, the auxiliary control circuitry 304 controls the auxiliary voltage $V_{AUX}$ as, for example, described in U.S. patent application Ser. No. 13/715,451, entitled "Isolation of Secondary Transformer Winding Current During Auxiliary Power Supply Generation", filed Dec. 14, 2012, and inventors John L. Melanson, Prashanth Drakshapalli, and Siddharth Maru, which is incorporated herein by reference in its entirety.

Figure 4:
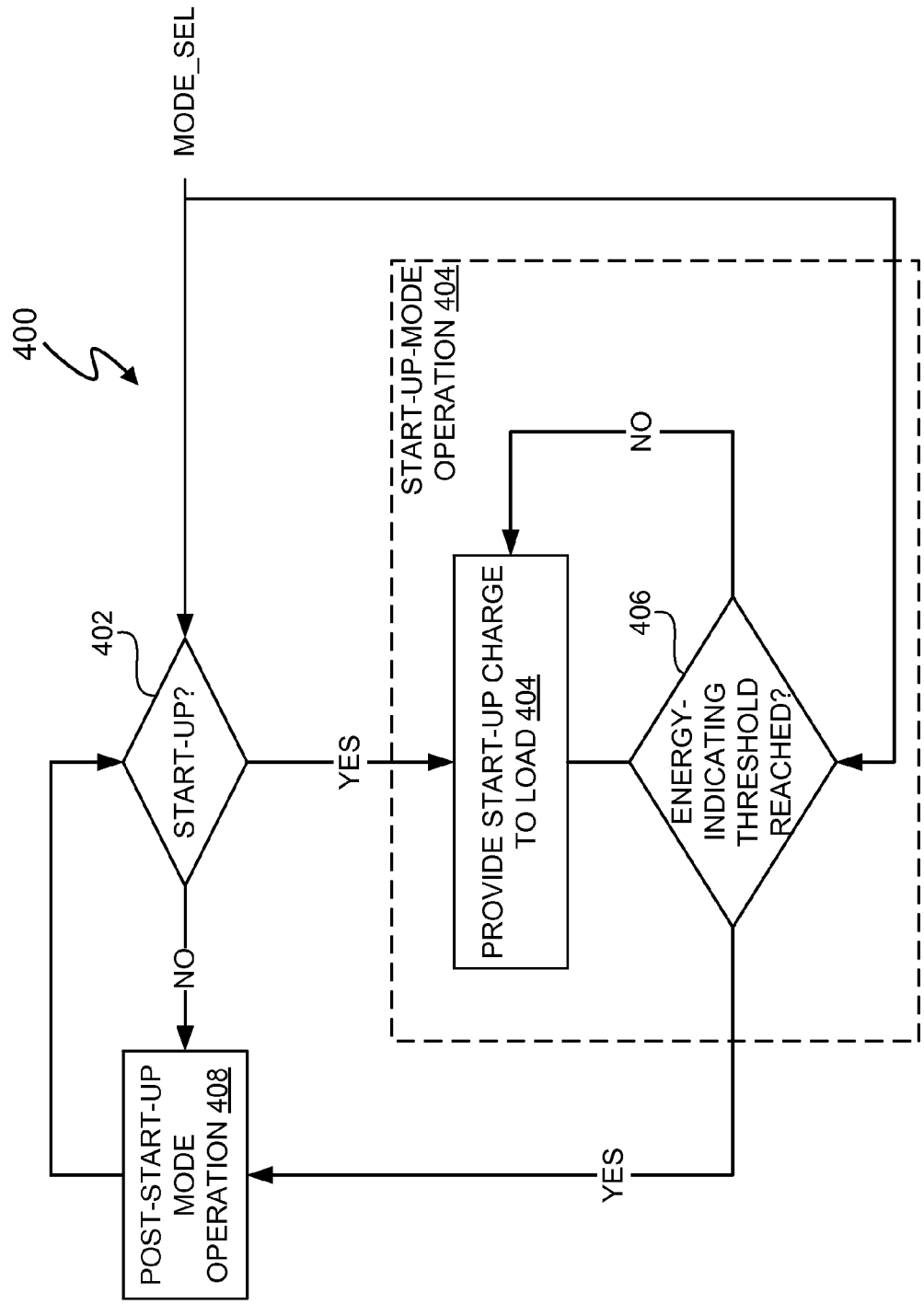
FIG. 4 depicts a start-up mode/post-start-up mode process for the electronic system of FIG. 3.
Figure 5:
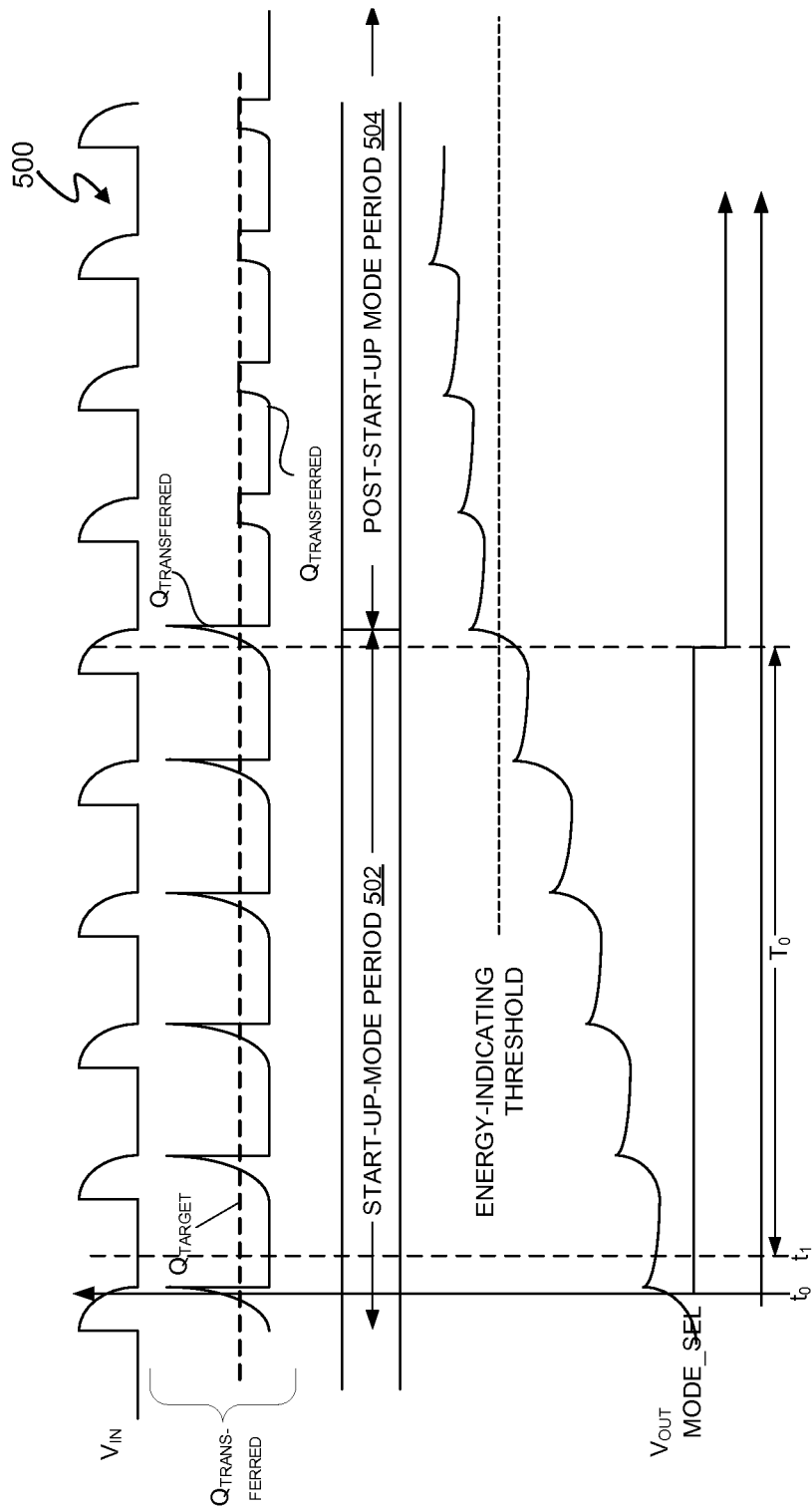
FIG. 5 depicts exemplary waveforms associated with the electronic system of FIG. 3 and process of FIG. 4.

FIG. 4 depicts a start-up mode/post-start-up mode process 400 (referred to herein as "SM-PSM process 400"). In at least one embodiment, the SM-PSM controller 306 operates in accordance with the SM-PSM process 400. FIG. 5 depicts exemplary waveforms 500 associated with the electronic system 300 and the SM-PSM process 400. Referring to FIGS. 3, 4, and 5, operation 402 determines if the electronic system 300 is in a start-up condition by monitoring a value of the mode select signal MODE_SEL. The value of the mode select signal MODE_SEL signal indicates whether the electronic system 300 is in a start-up condition or the electronic system 300 is in a normal-operating mode condition. The source of the mode select signal MODE_SEL is a matter of design choices. Exemplary generation of the Mode select signal MODE_SEL is subsequently discussed with reference to FIGS. 6-10.

At time $t_0$, the input voltage $V_{IN}$ has been at 0V for the equivalent of multiple cycles of an active input voltage $V_{IN}$, and, thus, the electronic system 300 is OFF. In at least one embodiment, the SM-PSM process 400 does not operate when the electronic system 300 does not operate. At time $t_1$, the dimmer 208 conducts current, which generates an exemplary leading edge of the input voltage $V_{IN}$, and the electronic system 300 turns ON. When the electronic system 300 turns ON, the SM-PSM controller 306 performs the SM-PSM process 400.

At time $t_1$, a value of the mode select signal MODE_SEL indicates that the electronic system 300 is in start-up mode, and the start-up operation 402 proceeds to operation 404, which initializes the start-up mode period 502 of the SM-PSM controller 306. The amount of time that elapses between when the load capacitor 207 is at 0V and when the load capacitor 207 reaches an operating voltage directly depends on the rate of the amount of charge delivered to the load capacitor 207. During the start-up mode period 502, the SM-PSM controller 306 controls the switch 304 so that the switching power converter 104 provides the secondary current $i_S$ with a start-up value to charge the load capacitor 207 and decrease the duration $T_0$ of the start-up mode period 502 relative to conventional processes. In at least one embodiment, during operation 404, the SM-PSM controller 306 ignores any synthetic limitations, such as a target charge level (which is subsequently discussed), on the amount of charge transferred to the load capacitor 207 and transfers more charge than the amount of charge that correlates to the phase angle of the input voltage $V_{IN}$. In at least one embodiment, the SM-PSM controller 306 causes the switching power converter 112 to provide as much charge as possible to the load capacitor 207 during the start-up mode period 502. Operation 406 monitors whether or not an energy-indicating threshold has been reached. In at least one embodiment, a change of the mode select signal MODE_SEL state indicates reaching the energy-indicating threshold. The particular energy-indicating threshold is a matter of design choice, such as a derivative of a voltage representing the load voltage $V_{LD}$ across the load capacitor 207, a threshold value of the load voltage $V_{LD}$, and/or a duration $T_{OFF\_CS}$ of an 'off' portion of the control signal CS to switch 304. These exemplary energy-indicating thresholds are subsequently discussed in more detail.

When operation 406 determines that the energy-indicating threshold has been reached and, thus, in at least one embodiment, the load voltage $V_{LD}$ has reached or approximately reached an operating level, the SM-PSM process 400 transitions to the post-start-up mode period 504 of post-start-up operation 408. During the post-start-up mode of operation 402, the SM-PSM controller 306 provides an amount of charge to the load capacitor 207 in direct correlation to the phase angle of the input voltage $V_{IN}$ so that the power delivered to the LED(s) 308 also tracks the phase angle. For example, as seen in the $Q_{TRANSFERRED}$ waveform of FIG. 5, during the post-start-up mode period 502, the SM-PSM controller 306 limits the amount of charge transferred to the load capacitor 207 to the determined target charge level $Q_{TARGET}$. As subsequently described in more detail, the SM-PSM controller 306 establishes the target charge level $Q_{TARGET}$ to correlate with the phase angle of the input voltage $V_{IN}$. When the phase angle of the input voltage $V_{IN}$ is less than 180 degrees, the target charge level $Q_{TARGET}$ is set below the maximum amount of charge that can be delivered to the load capacitor 207 by the switching power converter 104.

In at least one embodiment, the controller 302 controls switch 304 so that the switching power converter 104 transfers charge to the secondary-winding 116 until a predetermined charge target ($Q_{target}$) is met. Controller 302 determines the amount of charge transferred in each cycle of the switch 304 in accordance with Equation 1:

$$Q_{transferred} = \left(\frac{N1}{2}\right) \times I_{peak} \times T_2 \qquad \text{Equation 1}$$

N1 is the turns ratio between the secondary-winding 116 and the primary-winding 110, $I_{peak}$ is the peak value of the primary-side current $i_P$, and $T_2$ is the off time of switch 304 until the primary-side current $i_P$ decays to zero or until a new cycle of the control signal CS begins, whichever occurs first. Controller 206 determines the accumulated, transferred charge for 1 through M cycles of the input voltage $V_{IN}$ in accordance with Equation 2, where M is a positive integer:

$$Q_{total\_transferred} = \sum_{1}^{M} \left(\frac{N1}{2}\right) \times I_{peak} \times T_2 \qquad \text{Equation 2}$$

Controller 302 continues to transfer charge to the secondary-winding 116 until the accumulated, transferred charge equals $Q_{target}$. By isolating the transfer of charge to the secondary-winding 116 and the auxiliary-winding 124, the controller 306 can determine the accumulated amount of charge transferred to the load capacitor 207. The particular manner of operating the electronic system 300 during the post-start-up mode period 504 is a matter of design choice and is further illustratively described in U.S. patent application Ser. No. 13/715,914, entitled "Multi-mode Flyback Control for a Switching Power Converter", filed Dec. 14, 2012, and inventors Siddharth Maru, Zhaohui He, and Mohit Sood, which is hereby incorporated by reference in its entirety.

The manner of generating the control signal CS is a matter of design choice. In at least one embodiment, the control signal CS is generated as described in U.S. patent application Ser. No. 12/919,086, entitled "Primary-Side Control of a Switching Power Converter With Feed Forward Delay Compensation", inventors Zhaohui He, et al., and filing date Jun. 1, 2012, which is hereby incorporated by reference in its entirety.

Operation 402 continues to monitor the mode select signal MODE_SEL, and when the mode select signal MODE_SEL indicates that the electronic system has returned to start-up conditions, the SM-PSM process 400 repeats as previously described.

The particular implementation of controller 302 is a matter of design choice. For example, controller 302 can be (i) implemented as an integrated circuit including, for example, a processor to execute software or firmware instructions stored in a memory, (ii) implemented using discrete components, or (iii) implemented using any combination of the foregoing. Additionally, in at least one embodiment, all of the components in electronic system 300, except the voltage supply 206 and the dimmer 208, are included in a lamp.

Figure 6:
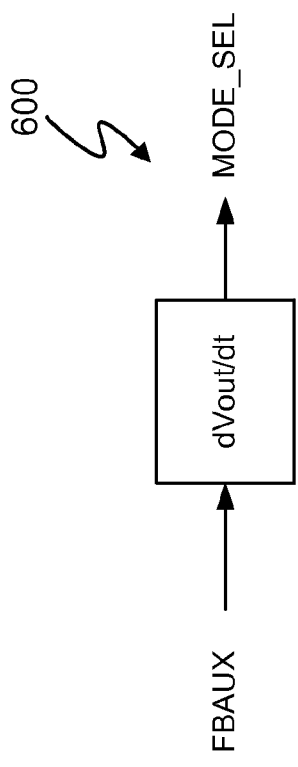
FIG. 6 depicts an exemplary mode select signal generator.

FIG. 6 depicts an exemplary mode select signal MODE_SEL generator 600. Referring to FIGS. 3 and 6, resistors 310 and 312 form a voltage divider so that the auxiliary feedback voltage FBAUX represents the auxiliary voltage $V_{AUX}$ as shown in Equation 3:

$$\text{FBAUX} = R1/(R1+R2) \cdot V_{AUX} \qquad \text{Equation 3}$$

where R1 equals the resistance value of resistor 312, and R2 equals the resistance value of the resistor 310. In at least one embodiment, the values of R1 and R2 are set so that auxiliary feedback voltage FBAUX is 1V when the load voltage $V_{LD}$ is at a nominal operating voltage level. The auxiliary voltage $V_{AUX}$ is proportional to the load voltage $V_{LD}$ as shown in Equation 4:

$$V_{AUX} = N2/N1 \cdot (V_{LD} + V_{FD}) \qquad \text{Equation 4}$$

where N2 is the turns ratio between auxiliary-winding 124 and the primary-side winding 110, N1 is the turns ratio between the secondary-side winding 116 and the primary-side winding 110, and $V_{FD}$ is the forward bias voltage of the diode 114. By substitution with Equation 3 and Equation 4, the auxiliary feedback voltage FBAUX is also proportional to the load voltage $V_{LD}$ as shown in Equation 5:

$$\text{FBAUX} = R1/(R1+R2) \cdot N2/N1 \cdot (V_{LD} + V_{FD}) \qquad \text{Equation 5}$$

Figure 7:
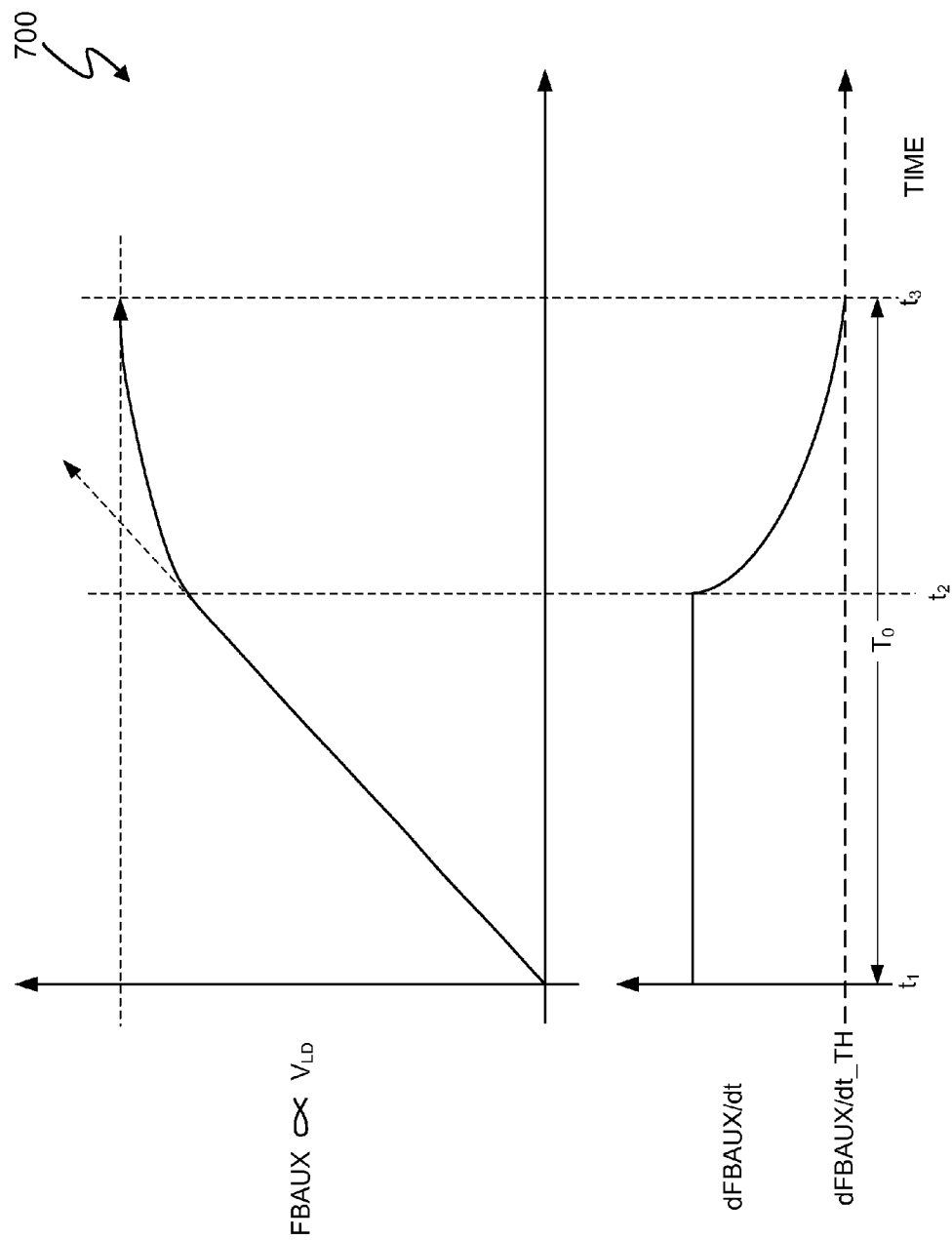
FIG. 7 depicts exemplary waveforms associated with the mode select signal generator of FIG. 6 and the electronic system of FIG. 3.

FIG. 7 depicts exemplary waveforms 700 associated with the electronic system 300 and mode select signal MODE_SEL generator 600. The mode select signal MODE_SEL generator 600 determines the derivative dFBAUX/dt of the feedback voltage FBAUX over time and changes the state of the mode select signal MODE_SEL from indicating the start-up mode to indicating the post-start-up mode when the dFBAUX/dt reaches a threshold value dFBAUX/dt_TH. The start-up mode period 502 (FIG. 5) begins at time $t_1$, and the feedback auxiliary voltage FBAUX rises approximately linearly until time $t_2$ as the switching power converter 104 provides charge to the load capacitor 207 to raise the load voltage $V_{LD}$. Thus, the derivative dFBAUX/dt of the auxiliary feedback voltage FBAUX over time is relatively constant. At time t2, the load voltage $V_{LD}$ approaches an operating voltage, and the rate of increase of the load voltage $V_{LD}$ and, thus, the feedback voltage FBAUX and the derivative dFBAUX/dt decreases. When the derivative dFBAUX/dt reaches the predetermined threshold value derivative dFBAUX/dt_TH at time $t_3$, the load voltage $V_{LD}$ has reached or has approximately reached the operating voltage, and the mode select signal MODE_SEL changes state and causes the SM-PSM controller 306 to enter the post-start-up mode 504 (FIG. 5). Thus, the predetermined threshold value derivative dFBAUX/dt represents one embodiment of the energy-indicating threshold. Because the predetermined threshold value derivative dFBAUX/dt is not dependent on absolute voltages, in at least one embodiment, the mode select signal MODE_SEL properly operates regardless of the value input voltage $V_{IN}$ and the operating voltage. The relationship between times $t_1$, $t_2$, and $t_3$ are illustrative and are not necessarily depicted to scale.

Figure 8:
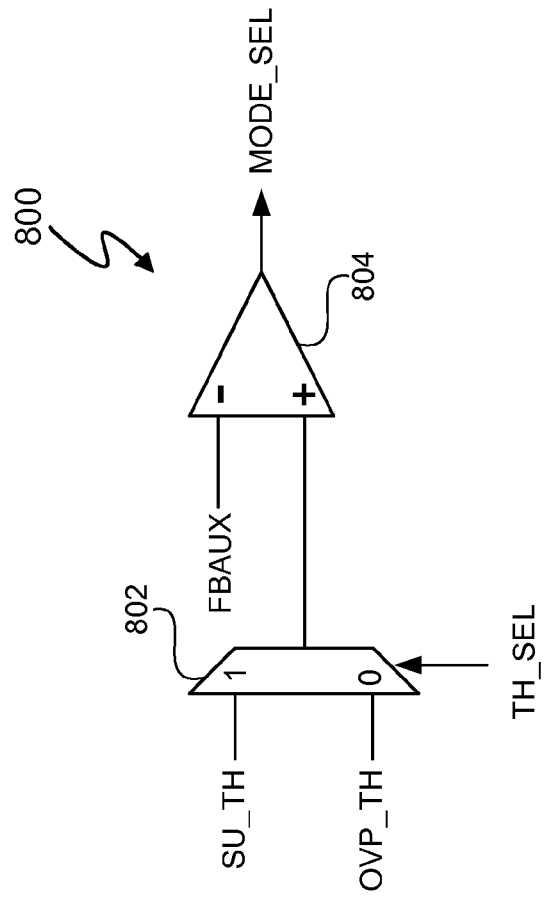
FIG. 8 depicts another exemplary mode select signal generator.

FIG. 8 depicts an exemplary mode select signal MODE_SEL generator 800. The mode select signal MODE_SEL generator 800 includes a multiplexer 802 that selects a start-up threshold value SU_TH or an over voltage protection threshold value OVP_TH depending on the state of the threshold voltage select signal TH_SEL. When the input voltage $V_{IN}$ is in a start-up condition, e.g. 0V for the equivalent of multiple cycles of an active input voltage $V_{IN}$, the SM-PSM controller 306 sets the state of the threshold voltage select signal TH_SEL so that the multiplexer 802 passes the start-up threshold value SU_TH to the non-inverting input of the multiplexer 802. The comparator 804 compares the start-up threshold value SU_TH to the auxiliary feedback voltage FBAUX on the inverting terminal The start-up threshold value SU_TH is set so that the mode select signal MODE_SEL output of the comparator 804 is a logical one until the auxiliary feedback voltage FBAUX represents an approximate operating value of the load voltage $V_{LD}$. Once the auxiliary feedback voltage FBAUX reaches the start-up threshold value SU_TH at time $t_3$, the mode select signal MODE_SEL transitions to a logical zero, and the SM-PSM controller 306 enters the post-start-up mode operation 408 and functions as previously described. The start-up threshold value SU_TH represents a scaled version of the approximate operating value of the load voltage $V_{LD}$. The scaling of the start-up threshold value SU_TH is same as in Equation 5 for the auxiliary feedback voltage FBAUX. In at least one embodiment, the mode select signal MODE_SEL generator 800 is not as flexible as the mode select signal MODE_SEL generator 600 because the start-up threshold value SU_TH depends on the value of the operating value of the load voltage $V_{LD}$. Thus, the start-up threshold value SU_TH represents another embodiment of the energy-indicating threshold of FIG. 4.

Figure 9:
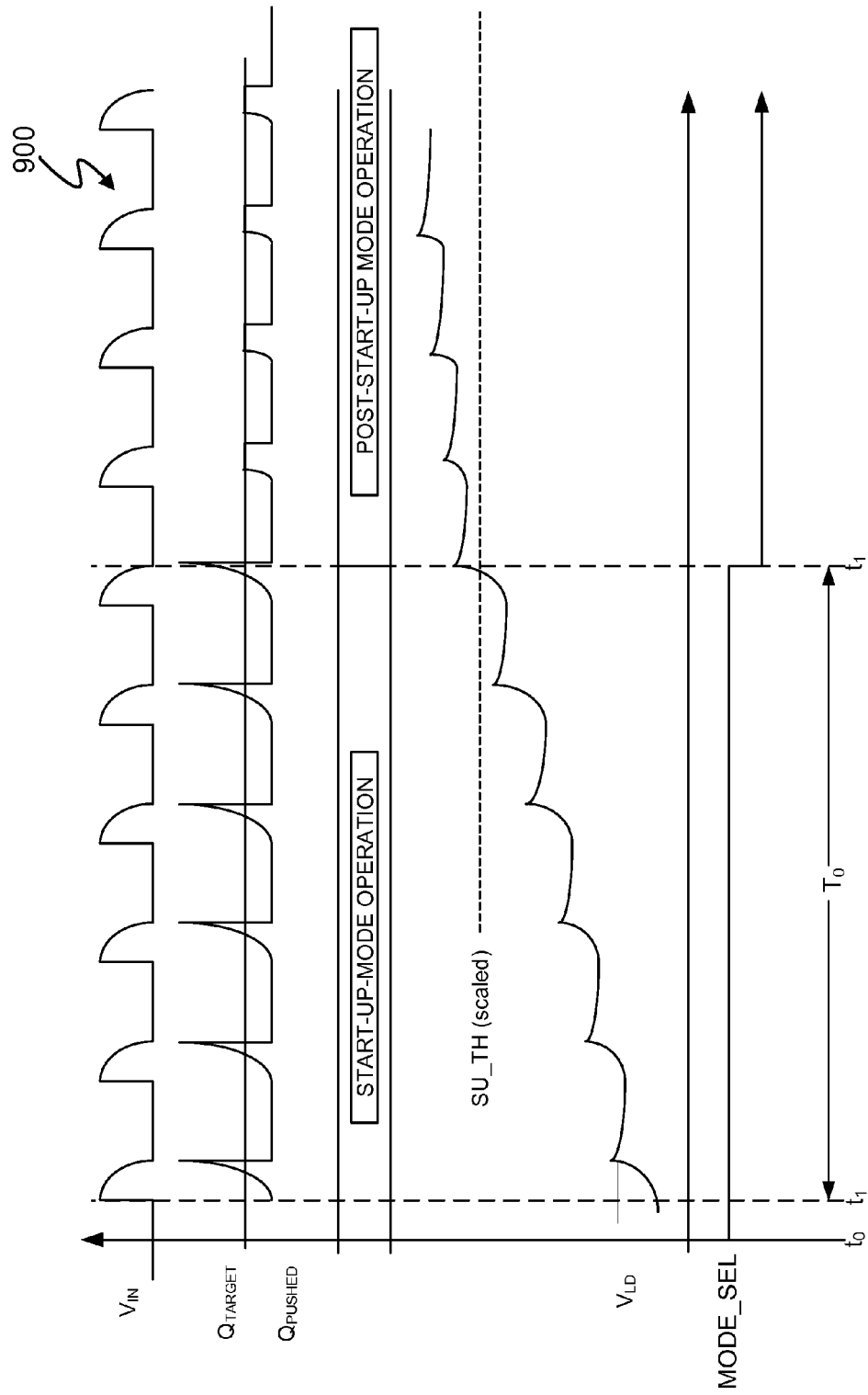
FIG. 9 depicts exemplary waveforms associated with the mode select signal generator of FIG. 8 and the electronic system of FIG. 3.

FIG. 9 depicts exemplary waveforms 900, which are associated with the electronic system 300 and the mode select signal MODE_SEL generator 700. As previously described, when the load voltage $V_{LD}$ reaches the scaled version of the start-up threshold value SU_TH, the load voltage $V_{LD}$ has reached an operating value, and the SM-PSM controller 306 enters the post-start-up mode operation 408.

Figure 10:
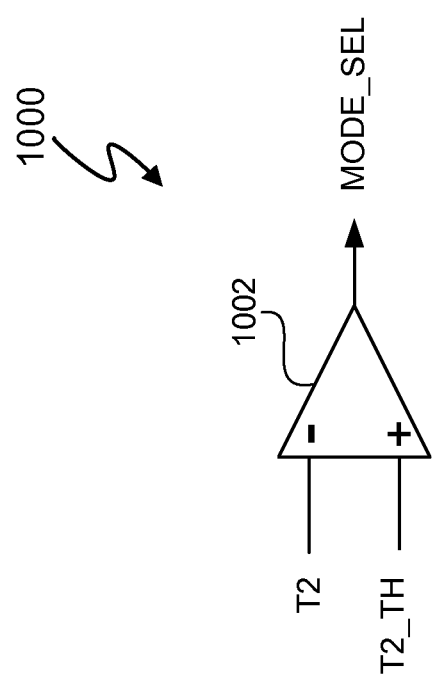
FIG. 10 depicts another exemplary mode select signal generator.
Figure 11:
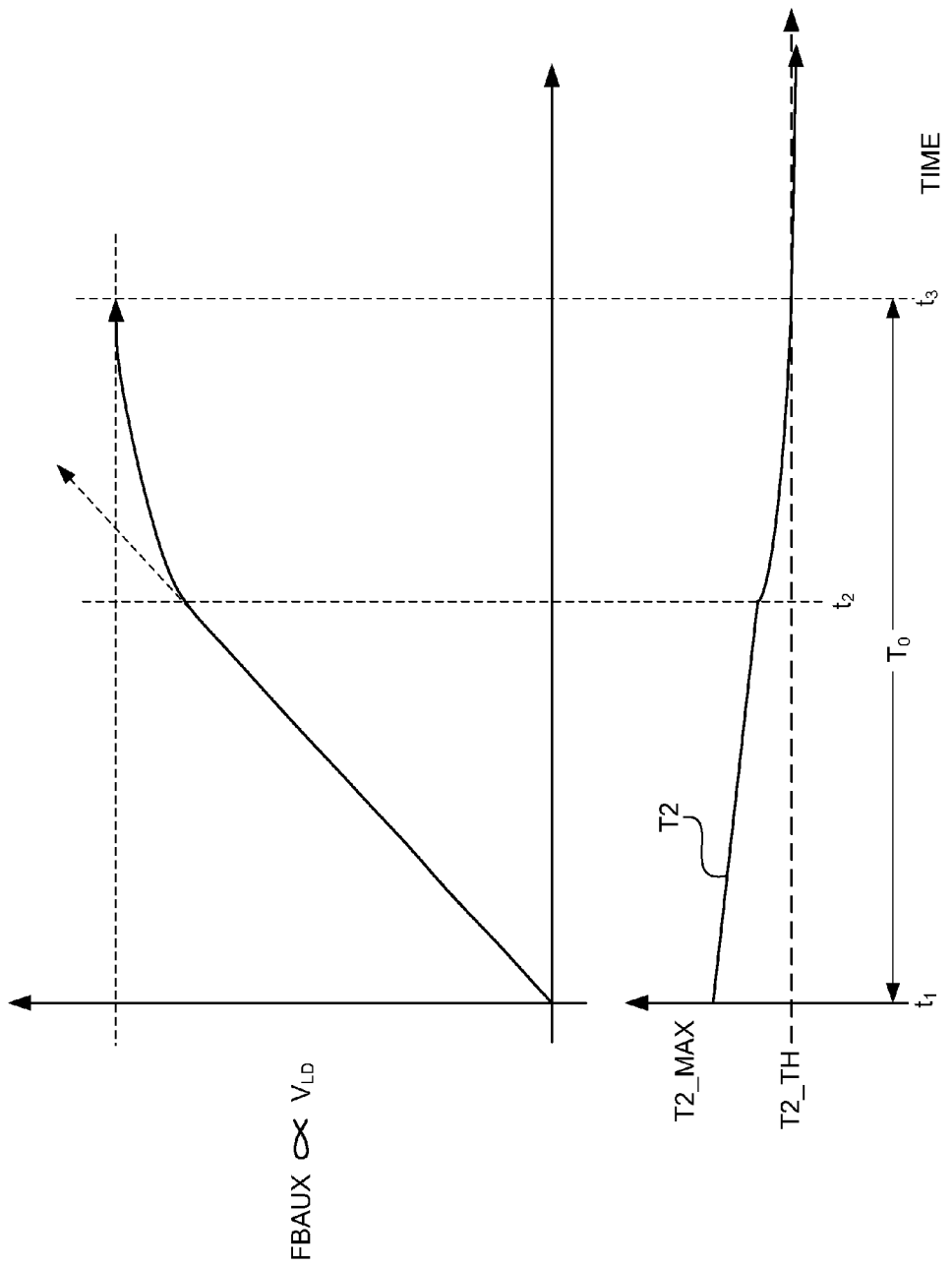
FIG. 11 depicts exemplary waveforms associated with the mode select signal generator of FIG. 10 and the electronic system of FIG. 3.

FIG. 10 depicts an exemplary mode select signal MODE_SEL generator 1000. FIG. 11 depicts exemplary waveforms 1100, which are associated with the electronic system 300 and the mode select signal MODE_SEL generator 1000. As the load voltage $V_{LD}$ approaches an operating value, less charge is transferred to the load capacitor 207. As indicated by Equation 5, as the off time $T_2$ of switch 304 decreases, less charged is transferred to the load capacitor 207. Thus, the duration of the off time T2 correlates to the operating value of the load voltage $V_{LD}$. Mode select signal MODE_SEL generator 1000 utilizes this insight when comparator 1002 compares the off time T2 against an off time threshold value T2_TH for switch 304. When the off time T2 decreases to the off time threshold value T2_TH, the load voltage $V_{LD}$ has reached an approximate operating value, and the SM-PSM controller 306 enters the post-start-up mode operation 408. Thus, the threshold value T2_TH represents another embodiment of the energy-indicating threshold of FIG. 4.

In at least one embodiment, the energy-indicating threshold is a predetermined time. When the energy-indicating threshold is a predetermined time, SM-PSM process 400 transitions from operation 406 to the post-start-up mode operation 408 after a predetermined time. In at least one embodiment, the predetermined time is any value within the range of 0.5-3 seconds.

Thus, an electronic system and method include a controller to operate in a start-up mode to accelerate driving a load to an operating voltage and then operates in a post-start-up mode.

Although embodiments have been described in detail, it should be understood that various changes, substitutions, and alterations can be made hereto without departing from the spirit and scope of the invention as defined by the appended claims.

What is claimed is:

1. A method comprising:
   detecting a start-up condition of a load, wherein (i) detecting a start-up condition comprises detecting a load voltage below a predetermined voltage threshold level and (ii) a start-up condition includes when the load voltage is below the predetermined voltage threshold level during a normal operation of a switching power converter;
   upon detecting the start-up condition:
     causing the switching power converter to provide an amount of charge to the load at a rate in accordance with a start-up mode until reaching an energy-indicating threshold;
     determining if the energy-indicating threshold has been reached; and
     when the energy-indicating threshold has been reached, causing the switching power converter to (i) decrease the amount of charge provided to the load relative to the charge provided to the load during the start-up mode and (ii) operate in a distinct post-start-up-mode.

2. The method of claim 1 wherein the predetermined voltage threshold level is 70% of a nominal, operating level of the load voltage.

3. The method of claim 1 wherein causing the switching power converter to provide an amount of charge in accordance with a start-up mode to provide power to the load until reaching the energy-indicating threshold further comprises:
   causing the switching power converter to provide a maximum amount of charge available to the switching power converter to provide to the load until reaching the energy-indicating threshold.

4. The method of claim 1 wherein the energy-indicating threshold comprises a rate of change of the load voltage over time and determining if the energy-indicating threshold has been reached comprises:
   determining if the rate of change of the load voltage over time is less than a predetermined threshold rate of change of the load voltage over time.

5. The method of claim 1 wherein the energy-indicating threshold comprises a predetermined load threshold voltage and determining if the energy-indicating threshold has been reached comprises:

determining if the load voltage is greater than the predetermined load threshold voltage.

6. The method of claim 1 wherein the switching power converter comprises a flyback-type switching power converter that includes a primary coil and a secondary coil, the energy-indicating threshold comprises a predetermined time threshold for a current in the secondary coil to decay to approximately zero, and determining if the energy-indicating threshold has been reached comprises:

determining if the time of the current in the secondary coil to decay to approximately zero is greater than the predetermined time threshold.

7. The method of claim 1 wherein causing the switching power converter to decrease the amount of charge provided to the load relative to the charge provided during the start-up mode and operate in a distinct post-start-up-mode comprises:

during each cycle of an input voltage to the switching power converter:
determining a target amount of charge for the switching power converter to provide to the load;
providing charge to the load until the amount of charge provided to the load approximately equals the target amount of charge; and
ceasing provision of charge to the load when the amount of charge provided to the load approximately equals the target amount of charge.

8. The method of claim 1 wherein the switching power converter comprises a single stage flyback-type converter.

9. The method of claim 1 wherein the load comprises one or more capacitors and one or more light emitting diodes.

10. The method of claim 3 further comprising:
during the start-up mode, disregarding a phase-cut angle in an input voltage to the switching power converter when causing the switching power converter to provide the maximum amount of charge.

11. An apparatus comprising:
a controller, wherein the controller is configured to:
detect a start-up condition of a load, wherein (i) to detect a start-up condition comprises to detect a load voltage below a predetermined voltage threshold level and (ii) a start-up condition includes when the load voltage is below the predetermined voltage threshold level during a normal operation of a switching power converter;
upon detection of the start-up condition:
cause the switching power converter to provide an amount of charge to the load at a rate in accordance with a start-up mode until reaching an energy-indicating threshold;
determine if the energy-indicating threshold has been reached; and
when the energy-indicating threshold has been reached, cause the switching power converter to (i) decrease the amount of charge provided to the load relative to the charge provided during the start-up mode and (ii) operate in a distinct post-start-up-mode.

12. The apparatus of claim 11 wherein the predetermined voltage threshold level is 70% of a nominal, operating level of the load voltage.

13. The apparatus of claim 11 wherein to cause switching power converter to provide an amount of charge in accordance with a start-up mode to provide power to the load until reaching the energy-indicating threshold the controller is further configured to:

cause the switching power converter to provide a maximum amount of charge available to the switching power converter to provide to the load until reaching the energy-indicating threshold.

14. The apparatus of claim 11 wherein the energy-indicating threshold comprises a rate of change of the load voltage over time and to determine if the energy-indicating threshold has been reached the controller is further configured to:

determine if rate of change of the load voltage over time is less than a predetermined threshold rate of change of the load voltage over time.

15. The apparatus of claim 11 wherein the energy-indicating threshold comprises a predetermined load threshold voltage and determining if the energy-indicating threshold has been reached the controller is further configured to:

determine if the load voltage is greater than the predetermined load threshold voltage.

16. The apparatus of claim 11 wherein the switching power converter comprises a flyback-type switching power converter that includes a primary coil and a secondary coil, the energy-indicating threshold comprises a predetermined time threshold for a current in the secondary coil to decay to approximately zero, and to determine if the energy-indicating threshold has been reached the controller is further configured to:

determine if the time of the current in the secondary coil to decay to approximately zero is greater than the predetermined time threshold.

17. The apparatus of claim 11 wherein to cause the switching power converter to decrease the amount of charge provided to the load relative to the charge provided during the start-up mode and operate in a distinct post-start-up-mode the controller is further configured to:

during each cycle of an input voltage to the switching power converter:
determine a target amount of charge for the switching power converter to provide to the load;
provide charge to the load until the amount of charge provided to the load approximately equals the target amount of charge; and
cease provision of charge to the load when the amount of charge provided to the load approximately equals the target amount of charge.

18. The apparatus of claim 11 wherein the switching power converter comprises a single stage flyback-type converter.

19. The apparatus of claim 11 wherein the load comprises one or more capacitors and one or more light emitting diodes.

20. The apparatus of claim 11 wherein the controller comprises an integrated circuit.

21. The apparatus of claim 13 wherein the controller is further configured to:

during the start-up mode, disregard a phase-cut angle in an input voltage to the switching power converter when causing the switching power converter to provide the maximum amount of charge.

22. An apparatus comprising:
a switching power converter;
a load coupled to the switching power converter; and
a controller, coupled to the switching power converter; wherein the controller is configured to:
detect a start-up condition of the load, wherein (i) to detect a start-up condition comprises to detect a load voltage below a predetermined voltage threshold level and (ii) a start-up condition includes when the load voltage is below the predetermined voltage threshold level during a normal operation of the switching power converter;

upon detection of the start-up condition:
cause the switching power converter to provide an amount of charge to the load at a rate in accordance with a start-up mode until reaching an energy-indicating threshold;
determine if the energy-indicating threshold has been reached; and
when the energy-indicating threshold has been reached, cause the switching power converter to (i) decrease the amount of charge provided to the load relative to the charge provided during the start-up mode and (ii) operate in a distinct post-start-up-mode.

23. The apparatus of claim 22 wherein the load comprises one or more light emitting diodes.

24. The apparatus of claim 22 wherein the switching power converter, the load, and controller are included in a lamp.

\* \* \* \* \*